(12) United States Patent
Tai

(10) Patent No.: US 11,789,049 B2
(45) Date of Patent: Oct. 17, 2023

(54) POWER DETECTOR

(71) Applicant: RichWave Technology Corp., Taipei (TW)

(72) Inventor: Shun-Nan Tai, Taipei (TW)

(73) Assignee: RichWave Technology Corp., Taipei (TW)

(*) Notice: Subject to any disclaimer, the term of this patent is extended or adjusted under 35 U.S.C. 154(b) by 20 days.

(21) Appl. No.: 17/137,383

(22) Filed: Dec. 30, 2020

(65) Prior Publication Data

US 2021/0318365 A1 Oct. 14, 2021

(30) Foreign Application Priority Data

Apr. 10, 2020 (TW) ................................ 109112138

(51) Int. Cl.
*G01R 21/14* (2006.01)
*G01R 15/00* (2006.01)
*H03K 17/56* (2006.01)

(52) U.S. Cl.
CPC ........... *G01R 21/14* (2013.01); *G01R 15/005* (2013.01); *H03K 17/56* (2013.01)

(58) Field of Classification Search
CPC ...... G01R 21/14; G01R 15/005; G01R 19/32; G01R 19/22; G01R 21/00; G01R 19/155; G01R 21/10; H03K 17/56; H03K 17/22; H03K 19/0175; H04B 17/00; H04B 17/101; H04B 17/318; H03H 7/01; H03F 3/189; H03F 1/56; H03F 2200/451; H03F 1/0261; H03F 2200/18; H03F 1/565; H03F 3/193; H03F 3/245; H03F 1/302; H03F 3/21; H03F 2200/294; H03F 1/0277; H03F 3/45475;
(Continued)

(56) References Cited

U.S. PATENT DOCUMENTS 5,486,787 A 1/1996 Maekawa
5,633,610 A * 5/1997 Maekawa ............... H03F 3/211
327/124
(Continued)

FOREIGN PATENT DOCUMENTS

TW 201445873 A 12/2014
TW 201636625 A 10/2016
(Continued)

OTHER PUBLICATIONS

Office action dated Jan. 5, 2023 for CN application No. 202010903024.3, filing date: Sep. 1, 2020, pp. 1-9.

*Primary Examiner* — John W Poos
*Assistant Examiner* — Tyler J Pereny
(74) *Attorney, Agent, or Firm* — Winston Hsu

(57) ABSTRACT

A power detector includes a detection circuit and a bias circuit. The detection circuit is used to receive an input signal and output a power indication signal. The bias circuit includes a first impedance unit, a second impedance unit and a transistor. The transistor includes a first terminal and a control terminal coupled to the first impedance unit, and a second terminal. The second impedance unit is coupled between the first terminal of the transistor and an output terminal of the bias circuit, or between the second terminal of the transistor and a second terminal of the bias circuit. The output terminal of the bias circuit is coupled to an input terminal of the detection circuit, and is used to output a bias signal.

19 Claims, 8 Drawing Sheets

(58) Field of Classification Search
CPC ... H03F 3/19; H03F 1/523; H03F 3/72; H03F 2200/555; H03F 3/195; H03F 1/30; H03F 3/45183; H03F 2200/387; H03F 1/52; H03F 1/34; H03F 2203/4544; H03F 3/45179

See application file for complete search history.

(56) References Cited

U.S. PATENT DOCUMENTS

| | | | |
|---|---|---|---|
| 7,890,065 B1* | 2/2011 | Liwinski | H03G 1/04 455/115.1 |
| 10,153,733 B2* | 12/2018 | Niu | H03F 1/302 |
| 10,296,026 B2* | 5/2019 | Caffee | G05F 1/468 |
| 10,425,071 B2* | 9/2019 | Karmaker | H03K 5/153 |
| 2002/0135423 A1* | 9/2002 | Yamashita | H03F 1/301 330/285 |
| 2011/0006846 A1* | 1/2011 | Miho | H03F 1/0266 330/278 |

FOREIGN PATENT DOCUMENTS

| | | |
|---|---|---|
| TW | 201706612 A | 2/2017 |
| WO | 2015/090357 A1 | 6/2015 |
| WO | 2019/086869 A1 | 5/2019 |

* cited by examiner

US 11,789,049 B2

POWER DETECTOR

CROSS REFERENCE TO RELATED APPLICATION

This non-provisional application claims priority of Taiwan patent application No. 109112138, filed on 10 Apr. 2020, included herein by reference in its entirety.

TECHNICAL FIELD

The invention relates to a power detector, and in particular, to a power detector capable of generating a power indication signal that is substantially invariant with temperature or varying slightly with temperature.

BACKGROUND

Power detectors are widely used in the field of communication to detect the magnitude of signals and generate corresponding power indication signals. However, the power indication signal is affected by the temperature owing to the electrical characteristics of the internal circuit of the power detector, and thus the corresponding power cannot be accurately determined, causing inconvenience in practical applications.

SUMMARY

According to one embodiment of the invention, a power detector includes a detection circuit and a bias circuit. The detection circuit includes an input terminal used to receive an input signal, and an output terminal used to output a power indication signal. The bias circuit includes a first terminal, a second terminal, an output terminal, a first impedance unit, a second impedance unit and a transistor. A first terminal of the first impedance unit is coupled to the first terminal of the bias circuit. A first terminal and a control terminal of the transistor are coupled to a second terminal of the first impedance unit, a second terminal of the transistor is coupled to the second terminal of the bias circuit. The second impedance unit is coupled between the first terminal of the transistor and the output terminal of the bias circuit, or is coupled between the second terminal of the transistor and the second terminal of the bias circuit, and the first terminal of the transistor is further coupled to the output terminal of the bias circuit. The output terminal of the bias circuit is coupled to the input terminal of the detection circuit, and is used to output a bias signal.

DETAILED DESCRIPTION

Figure 1:
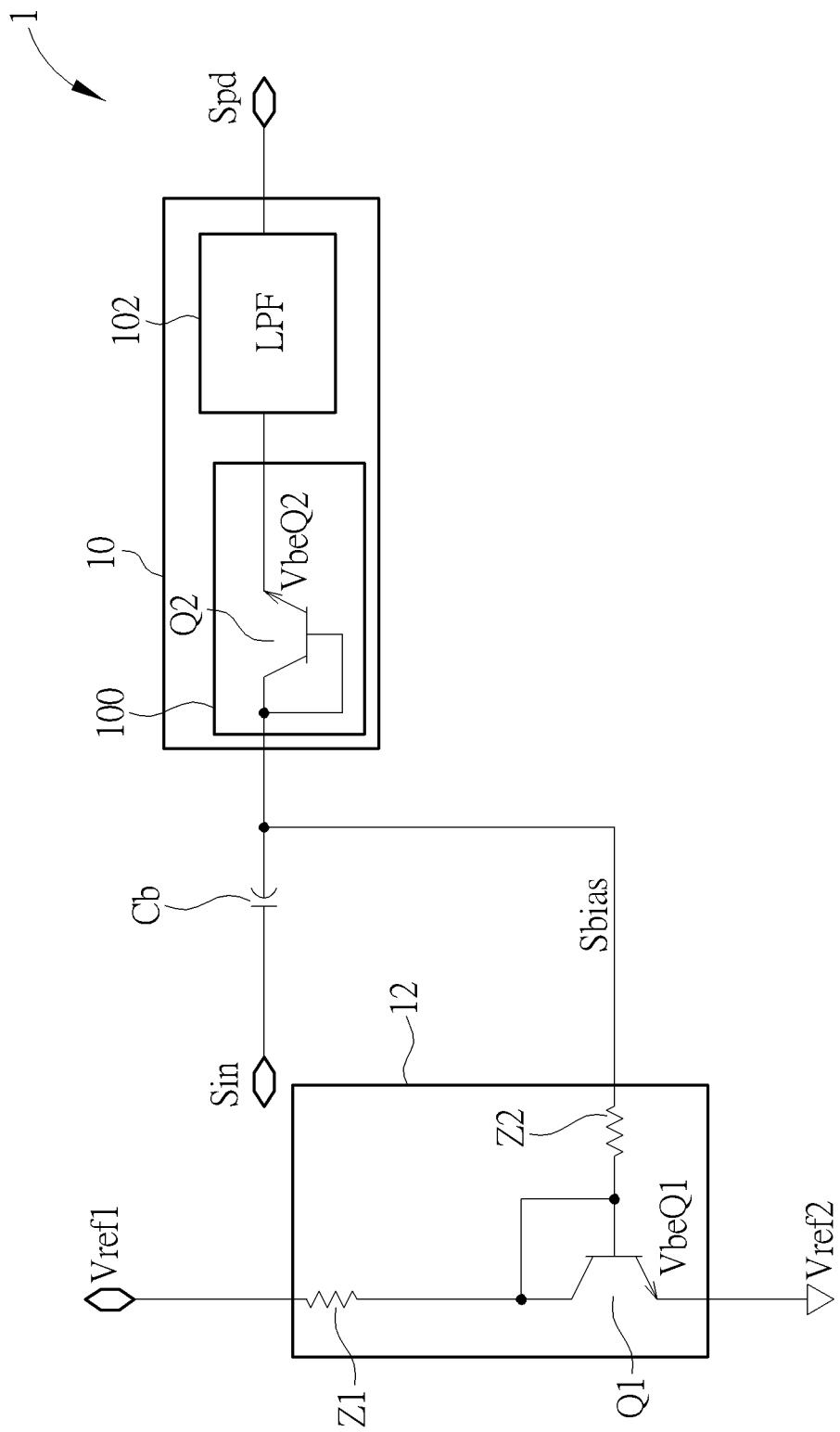
FIG. 1 is a circuit schematic of a power detector according to an embodiment of the invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 is a circuit schematic of a power detector 1 according to an embodiment of the invention. The power detector 1 may receive an input signal Sin and detect the amplitude of the input signal Sin to generate a power indication signal Spd that is substantially invariant with temperature or varying slightly with temperature. The input signal Sin may be an alternating current (AC) signal, and specifically, a radio frequency (RF) signal. The power indication signal Spd may be a direct current (DC) voltage corresponding to the power of the input signal Sin. The power detector 1 may include a capacitor Cb, a detection circuit 10 and a bias circuit 12. The capacitor Cb and the bias circuit 12 may be coupled to the detection circuit 10. The capacitor Cb may be a DC block capacitor.

The detection circuit 10 may include an input terminal and an output terminal. The input terminal of the detection circuit 10 may receive the input signal Sin, and the output terminal may output the power indication signal Spd. The bias circuit 12 may include a first terminal, a second terminal, an output terminal, impedance units Z1 and Z2 and a transistor Q1. The first terminal of the bias circuit 12 may receive an operating voltage Vref1, the second terminal of the bias circuit 12 may receive an operating voltage Vref2, the output terminal of the bias circuit 12 may be coupled to the input terminal of the detection circuit 10 and may output a bias signal Sbias, so as to provide the detection circuit 10 an appropriate operating point. The bias signal Sbias may be a DC voltage. The impedance unit Z1 may include a first terminal and a second terminal. The first terminal of the impedance unit Z1 may be coupled to the first terminal of the bias circuit 12. The transistor Q1 may include a first terminal, a second terminal and a control terminal. The first terminal of the transistor Q1 may be coupled to the second terminal of the impedance unit Z1, the second terminal of the transistor Q1 may be coupled to the second terminal of the bias circuit 12, and the control terminal of the transistor Q1 may be coupled to the second terminal of the impedance unit Z1. The impedance unit Z2 may include a first terminal and a second terminal. The first terminal of the impedance unit Z2 may be coupled to the first terminal of the transistor Q1, and the second terminal of the impedance unit Z2 may be coupled to the output terminal of the bias circuit 12. In some embodiments, the first terminal of the impedance unit Z2 may be coupled to the second terminal of the transistor Q1, the second terminal of the impedance unit Z2 may be coupled to the second terminal of the bias circuit 12. In such a case, the first terminal of the transistor Q1 may be further coupled to the output terminal of the bias circuit 12. The impedance unit Z1 may be a resistor, a capacitor, an inductor, or a combination thereof. FIG. 1 shows an example of the impedance unit Z1 being a resistor. The impedance unit Z1 may serve as a current limiting resistor for use to limit the current flowing to the transistor Q1. The impedance unit Z2 may be a resistor, a capacitor, an inductor, or a combination thereof. FIG. 1 shows an example of the impedance unit Z2 being a resistor. The impedance unit Z2 may serve as an isolation resistor for use to reduce or block the input signal Sin from leaking to the first terminal and the second terminal of the bias circuit 12 via the transistor Q1.

The operating voltage Vref1 may be a supply voltage of the bias circuit 12 or a control voltage of the bias circuit 12. The operating voltage Vref2 may be a ground voltage, e.g., 0 volts (V). When the operating voltage Vref1 is the supply voltage of the bias circuit 12, the operating voltage Vref1 may be 3V. When the operating voltage Vref1 is the control voltage of the bias circuit 12, the operating voltage Vref1 may be in the range of 0V to 3V. For example, if the operating voltage Vref1 is less than a voltage VbeQ1 between the control terminal and the second terminal of the transistor Q1, e.g., the operating voltage Vref1 may be 0V, the transistor Q1 may be turned off, the bias circuit 12 is in an off-state, and the bias circuit 12 may not generate the bias signal Sbias; if the operating voltage Vref1 is higher than the voltage VbeQ1, e.g., the operating voltage Vref1 may be 3V, the transistor Q1 may be turned on, the bias circuit 12 is in an on-state, and the bias circuit 12 may generate the bias signal Sbias. In some embodiments, the operating voltage Vref1 may be provided by an external circuit, and the external circuit may be, for example, a low dropout regulator (LDO).

The detection circuit 10 may further include PN junction component 100 including a first terminal and a second terminal. The first terminal of the PN junction component 100 may be coupled to the input terminal of the detection circuit 10, and the second terminal of the PN junction component 100 may be coupled to the output terminal of the detection circuit 10. The PN junction component 100 may include a diode or a transistor, and may have a forward voltage negatively correlated to the temperature. FIG. 1 shows an example of the PN junction component 100 including a transistor Q2. The transistor Q2 may include a first terminal, a second terminal and a control terminal. The first terminal of the transistor Q2 may be coupled to the first terminal of the PN junction component 100, the second terminal of the transistor Q2 may be coupled to the second terminal of the PN junction component 100, and the control terminal of the transistor Q2 may be coupled to the first terminal of the transistor Q2. Since the transistor Q2 is a diode-connected transistor, a voltage VbeQ2 between the control terminal and the second terminal of the transistor Q2 may be regarded as the forward voltage. Further, in the embodiment where the PN junction component 100 includes a diode, the diode may include a first terminal and a second terminal. The first terminal of the diode may be coupled to the first terminal of the PN junction component 100, and the second terminal of the diode may be coupled to the second terminal of the PN junction component 100. The first terminal of the diode may be an anode, and the second terminal may be a cathode. The detection circuit 10 may further include a low-pass filter 102 coupled between the second terminal of the PN junction component 100 and the output terminal of the detection circuit 10. The PN junction component 100 may function as a half-wave rectifier receiving the input signal Sin to generate a rectified input signal Sin. The low-pass filter 102 may reduce ripples in the rectified input signal Sin to generate the power indication signal Spd. The low-pass filter 102 may include resistors and capacitors connected in series or in parallel.

The transistors Q1 and Q2 may be of the same transistor type, such as bipolar junction transistors (BJT), heterojunction bipolar transistors (HBT) or field effect transistors (FET), and may be connected in the diode configuration. In some embodiments, the size of transistor Q1 may be substantially equal to the size of transistor Q2. In other embodiments, the size of the transistor Q1 may be different from the size of the transistor Q2. In other embodiments, both the transistors Q1 and Q2 may have temperature coefficients of the same sign. The temperature coefficients of the same sign may be negative temperature coefficients. That is, the voltages VbeQ1 and VbeQ2 are negatively correlated to the temperature. In other embodiments, the temperature coefficients of the same sign may be positive temperature coefficients.

The forward voltage of the PN junction component 100 is negatively correlated to the temperature. For example, the forward voltage of the PN junction component 100 may be a 1.3V at lower temperatures, and the forward voltage of the PN junction element 100 may be 1.2V at higher temperatures. In the related art, a bias circuit of a power detector is used to provide a bias signal with a fixed voltage value to the detection circuit. In such a case, when the detection circuit receives identical input signals at a high temperature and a low temperature, the detection circuit will output a higher power indication signal at the high temperature than that at the low temperature, resulting in an error in the power indication signals at the high temperature and the low temperature. If the bias circuit 12 in the embodiment is used, when the identical input signals Sin are input into the detection circuit 10 at both the high and low temperatures, the power indication signal Spd at the low temperature or the power indication signal Spd at the high temperature may be selected as an output reference of the detection circuit 10.

For example, if the power indication signal Spd at the low temperature is adopted as the output reference of the detection circuit 10, when the temperature rises, the forward voltage of the PN junction component 100 will be lower than that at the low temperature, and the voltage of the power indication signal Spd will increase. Since the voltage VbeQ1 is also negatively correlated to the temperature, the voltage VbeQ1 will decrease accordingly. As a result, the bias signal Sbias generated by the bias circuit 12 will decrease with the voltage VbeQ1, that is, the bias signal Sbias is negatively correlated to the temperature. Compared to the related art, the detection circuit 10 may receive the bias signal Sbias having a lower voltage, and therefore, the detection circuit 10 may output the power indication signal Spd having a relatively lower voltage. Consequently, the voltage of the power indication signal Spd at the high temperature may approximate to the voltage of the power indication signal Spd at the low temperature. In other words, the bias signal Sbias having a lower voltage may be used to compensate for the increase of the power indication signal Spd owing to the forward voltage change of the PN junction component 100. For example, the lowered voltage of the bias signal Sbias may be used to reduce the increased portion in the power indication signal Spd at the high temperature, and therefore the power indication signal Spd output from the detection circuit 10 may be substantially invariant or may only slightly vary with the increasing temperature. Similarly, if the power indication signal Spd at the high temperature is adopted as the output reference of the detection circuit 10, when the temperature drops, the forward voltage of the PN junction component 100 will be higher than that at the high temperature, and the voltage of the power indication signal Spd will decrease. Since the voltage VbeQ1 is also negatively correlated to the temperature, the voltage VbeQ1 will increase accordingly. As a result, the bias signal Sbias generated by the bias circuit 12 will increase with the voltage VbeQ1, that is, the bias signal Sbias is negatively correlated to the temperature. Compared to the related art, the detection circuit 10 may receive a bias signal Sbias having a higher voltage, and therefore, the detection circuit 10 may output the power indication signal Spd having a relatively higher voltage. Consequently, the voltage of the power indication signal Spd at the low temperature may approximate the voltage of the power indication signal Spd at the high temperature. In other words, the bias signal Sbias having a higher voltage may be used to compensate for the decrease of the power indication signal Spd owing to the forward voltage change of the PN junction component 100. For example, the bias signal Sbias having the higher voltage may be used to increase the decreased portion in the power indication signal Spd at the low temperature, and therefore the power indication signal Spd output from the detection circuit 10 may be substantially invariant or may only slightly vary with the decreasing temperature. In other embodiments, a PN junction component 100 having the forward voltage positively correlated to the temperature may be adopted, and the bias circuit 12 may be designed to generate a bias signal Sbias positively correlated to the temperature. Consequently, the detection circuit 10 may generate the power indication signal Spd substantially invariant with temperature or varying slightly with temperature.

Figure 2:
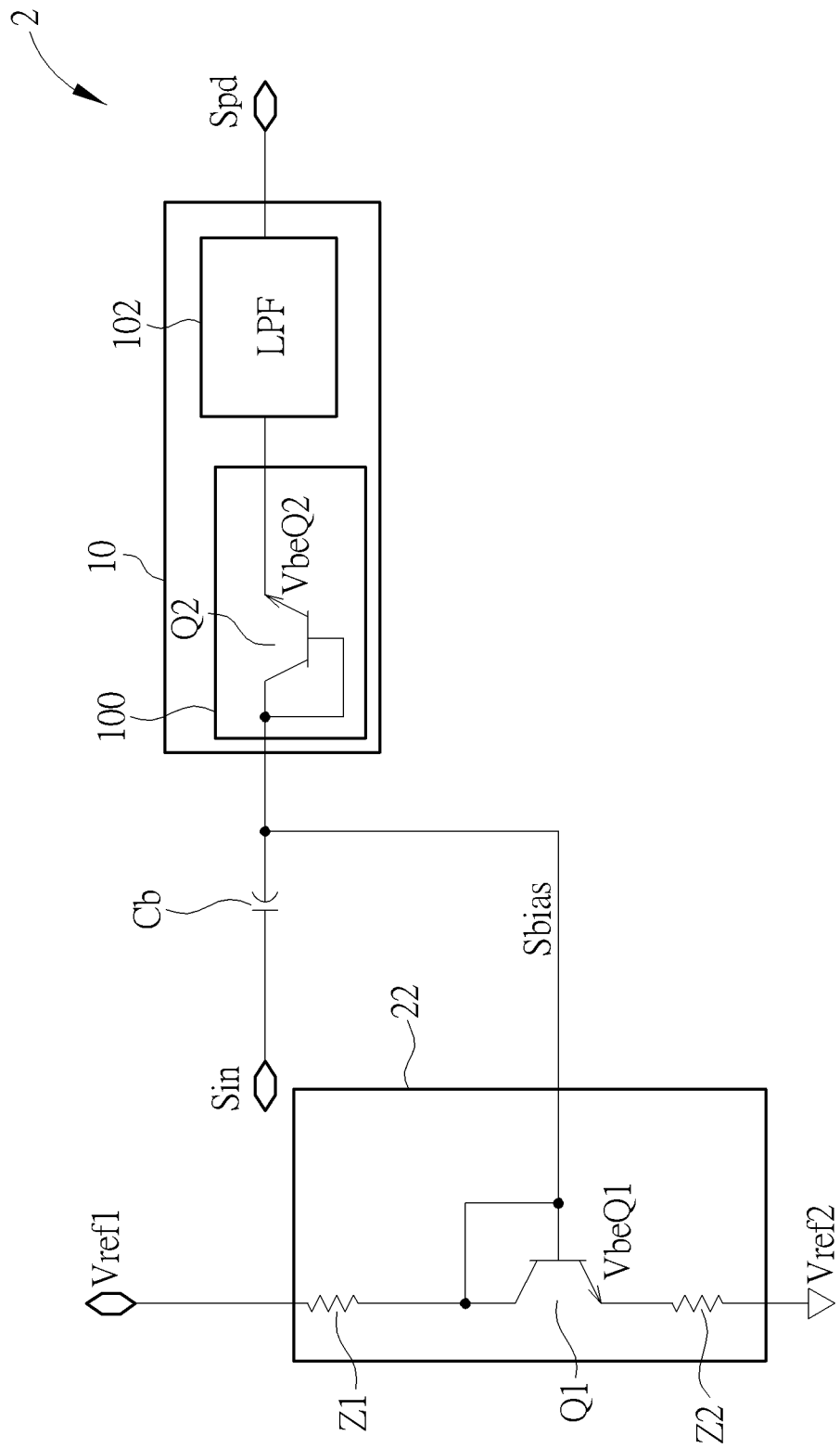
FIG. 2 is a circuit schematic of a power detector according to another embodiment of the invention.

FIG. 2 is a circuit schematic of a power detector 2 according to another embodiment of the invention. The configurations, connections and operations of the power detector 2 are similar to the power detector 1, the difference lies in that the power detector 2 employs a bias circuit 22 in place of the bias circuit 12. Compared to the bias circuit 12, the bias circuit 22 includes an impedance unit Z2 having a first terminal coupled to the second terminal of the transistor Q1, and a second terminal coupled to the second terminal of the bias circuit 22, and the first terminal of the transistor Q1 may be further coupled to the output terminal of the bias voltage 22. Further, the second terminal of the transistor Q1 may be coupled to the second terminal of the bias circuit 22 via the impedance unit Z2.

Figure 3:
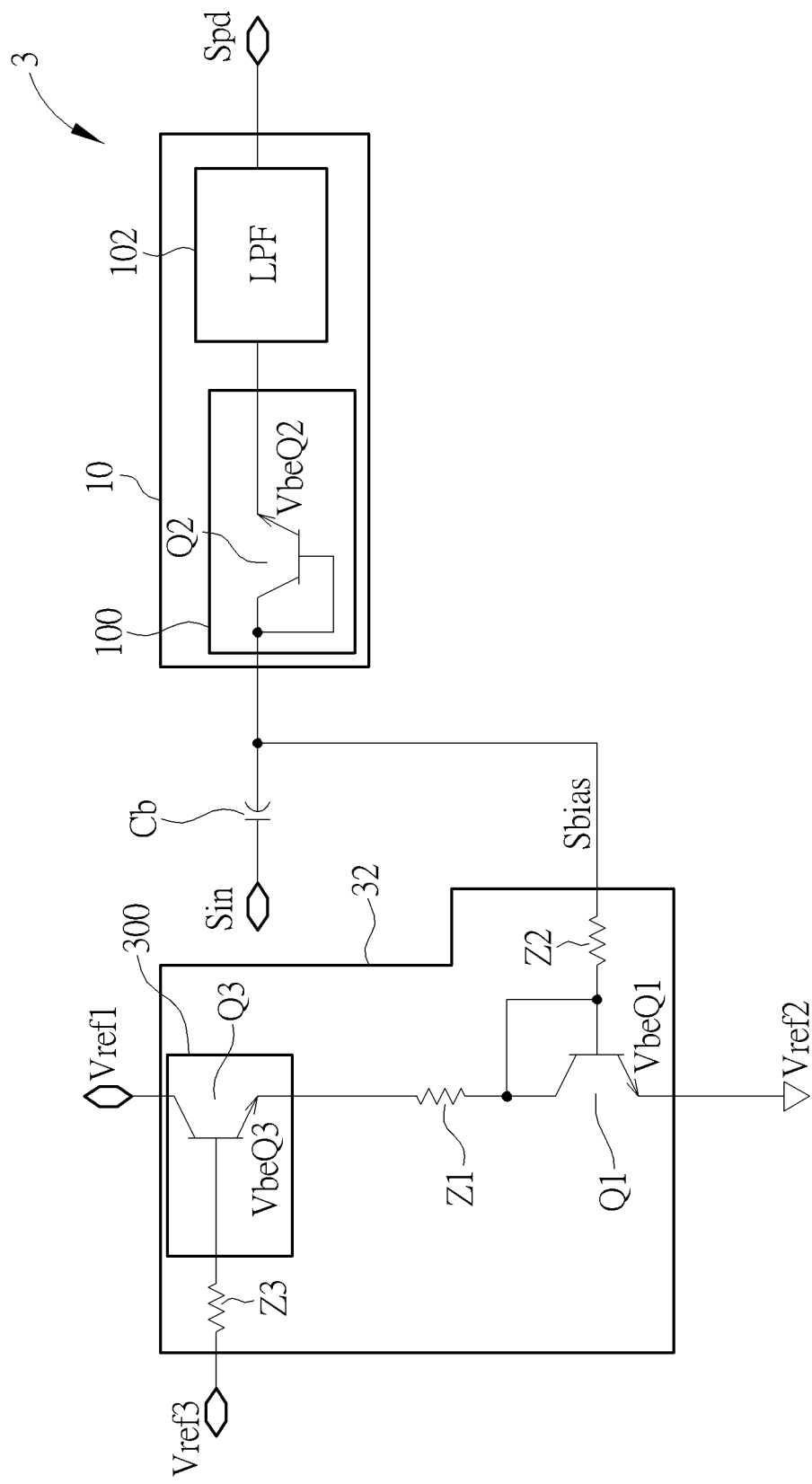
FIG. 3 is a circuit schematic of a power detector according to another embodiment of the invention.

FIG. 3 is a circuit schematic of a power detector 3 according to another embodiment of the invention. The configurations and connections of the power detector 3 are similar to the power detector 1, the difference lies in that the power detector 3 employs a bias circuit 32 in place of the bias circuit 12.

Compared to the bias circuit 12, the bias circuit 32 further includes an impedance unit Z3 and a switch unit 300. Explanation for the impedance unit Z3 and the switch unit 300 will be provided in the following paragraphs. The impedance unit Z3 may include a first terminal and a second terminal. The first terminal of the impedance element Z3 may be used to receive the operating voltage Vref3. The switch unit 300 may include a first terminal, a second terminal and a control terminal. The first terminal of the switch unit 300 may be coupled to a first terminal of the bias circuit 32 and configured to receive the operating voltage Vref1, the second terminal of the switch unit 300 may be coupled to the first terminal of the impedance unit Z1, the control terminal of the switch unit 300 may be coupled to the second terminal of the impedance unit Z3 and configured to receive the operating voltage Vref3 via the impedance unit Z3. The first terminal of the impedance unit Z1 may be coupled to the first terminal of the bias circuit 32 via the switch unit 300. The impedance unit Z3 may be a resistor, a capacitor, an inductor, or a combination thereof. FIG. 3 shows an example of the impedance unit Z3 being a resistor. The impedance unit Z3 may be a current limiting resistor to limit the current flowing to a control terminal of a transistor Q3 of the switch unit 300. In some embodiments, the impedance unit Z3 may be omitted, and the control terminal of the switch unit 300 may directly receive the operating voltage Vref3.

The switch unit 300 may include the transistor Q3. The transistor Q3 may include a first terminal, a second terminal and the control terminal. The first terminal of the transistor Q3 may be coupled to the first terminal of the switch unit 300, the second terminal of the transistor Q3 may be coupled to the second terminal of the switch unit 300, and the control terminal of the transistor Q3 may be coupled to the control terminal of the switch unit 300. The operating voltage Vref1 may be the supply voltage of the bias circuit 32. The operating voltage Vref3 may be the control voltage of the bias circuit 32. The switch unit 300 may be used to control activation of the bias circuit 32. When the operating voltage Vref3 is a low voltage, e.g., a voltage less than a voltage VbeQ3 between the control terminal and the second terminal of the transistor Q3, the transistor Q3 may be turned off, the bias circuit 32 is in an off-state, and the bias circuit 32 may not generate the bias signal Sbias. When the operating voltage Vref3 is a high voltage, e.g., a voltage higher than the voltage VbeQ3, the transistor Q3 may be turned on, the bias circuit 32 is in an on-state, and the bias circuit 32 may generate the bias signal Sbias. In some embodiments, the operating voltage Vref3 may be provided by an external circuit, e.g., an LDO. The transistor Q3 may be a BJT, an HBT, an FET or other types of transistors. In some embodiments, the transistors Q1 to Q3 may be of the same transistor type. In other embodiments, the transistor type of the transistor Q3 may be different from the transistor type of the transistors Q1 and Q2. For example, the transistor Q3 may be an FET, and the transistors Q1 and Q2 may be BJTs or HBTs. In some embodiments, when the transistors Q1, Q2 or Q3 are BJTs or HBTs, the first terminal may be a collector, the second terminal may be an emitter, and the control terminal may be a base. When the transistors Q1, Q2 or Q3 are FETs, the first terminal may be a drain, the second terminal may be a source, and the control terminal may be a gate. In some embodiments, all the transistors Q1 to Q3 may have temperature coefficients of the same sign, e.g., all of which may have negative temperature coefficients or positive temperature coefficients.

Figure 4:
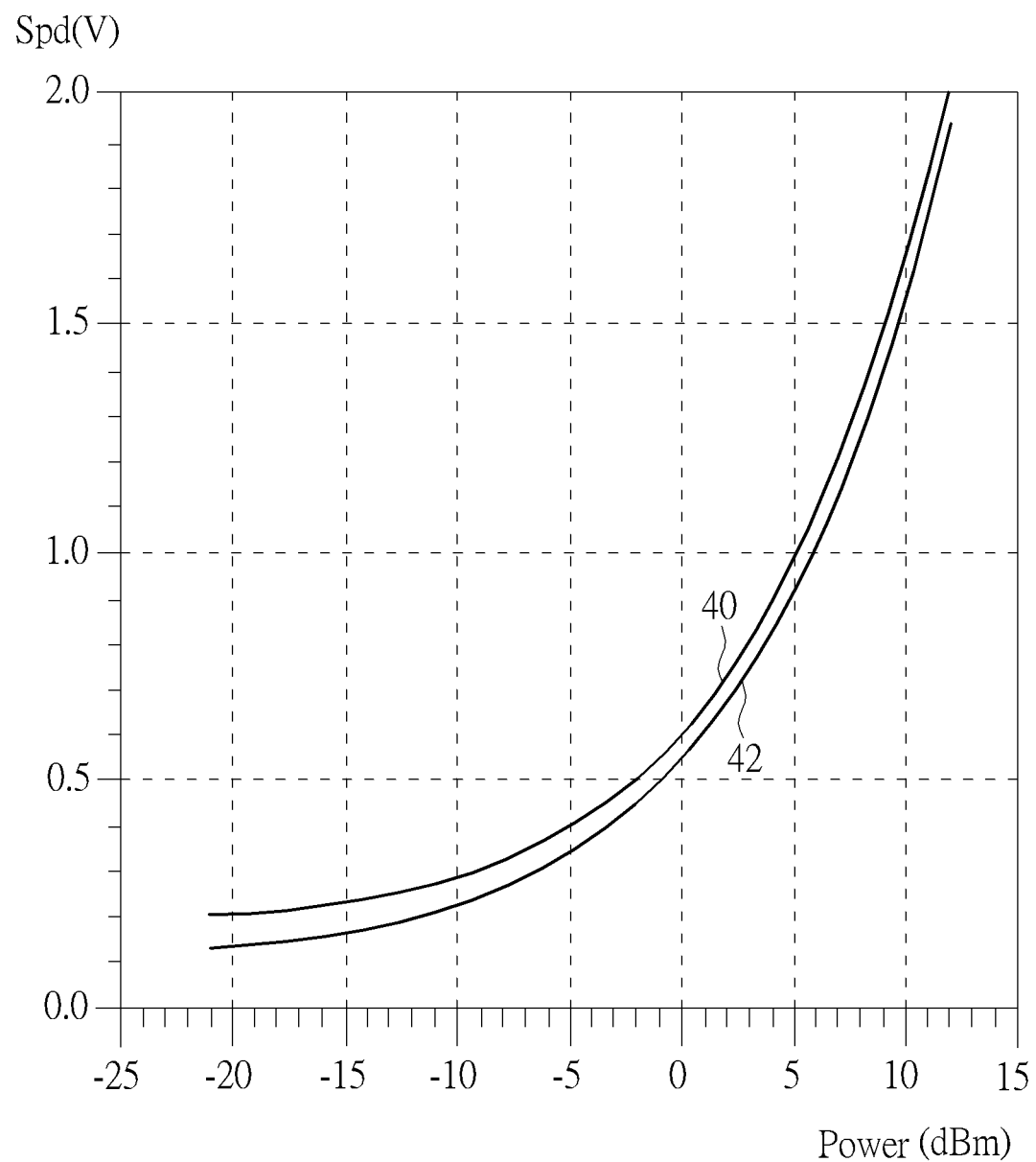
FIG. 4 shows the temperature response of the power indication signals of the power detector in FIG. 3 with respect to power.

FIG. 4 shows the temperature response of the power indication signals Spd of the power detector 3 in FIG. 3 with respect to power, where the horizontal axis represents the power, and the vertical axis represents the power indication signal Spd. FIG. 4 shows curves 40 and 42. When the power detector 3 receives identical input signals Sin at a low temperature (e.g. −20 degrees Celsius) and a high temperature (e.g. 120 degrees Celsius), the curve 40 represents the relationship between the power indication signal Spd of the power detector 3 and the corresponding powers at the high temperature, and the curve 42 represents the relationship between the power indication signal Spd of the power detector 3 and the corresponding powers at the low temperature. When the power indication signal Spd at a low temperature is employed as the output reference of the detection circuit 10, the curves 40 and 42 show a difference between the power indication signal Spd at the high temperature and the power indication signal Spd at the low temperature is substantially in the range of 76 mV, and the power indication signal Spd at the high temperature substantially approximates the power indication signal Spd at the low temperature. In the related art, the bias circuit of the power detector is used to provide a bias signal with a fixed voltage value. A difference between the power indication signal at the high temperature and the power indication signal at the low temperature is approximately in the range of 160 mV. Therefore, compared to the related art, the power detector 3 reduces the error between the power indication signal Spd at the high temperature and the power indication signal Spd at the low temperature, so that the magnitude of the power indication signal Spd only varies slightly with the temperature.

Figure 5:
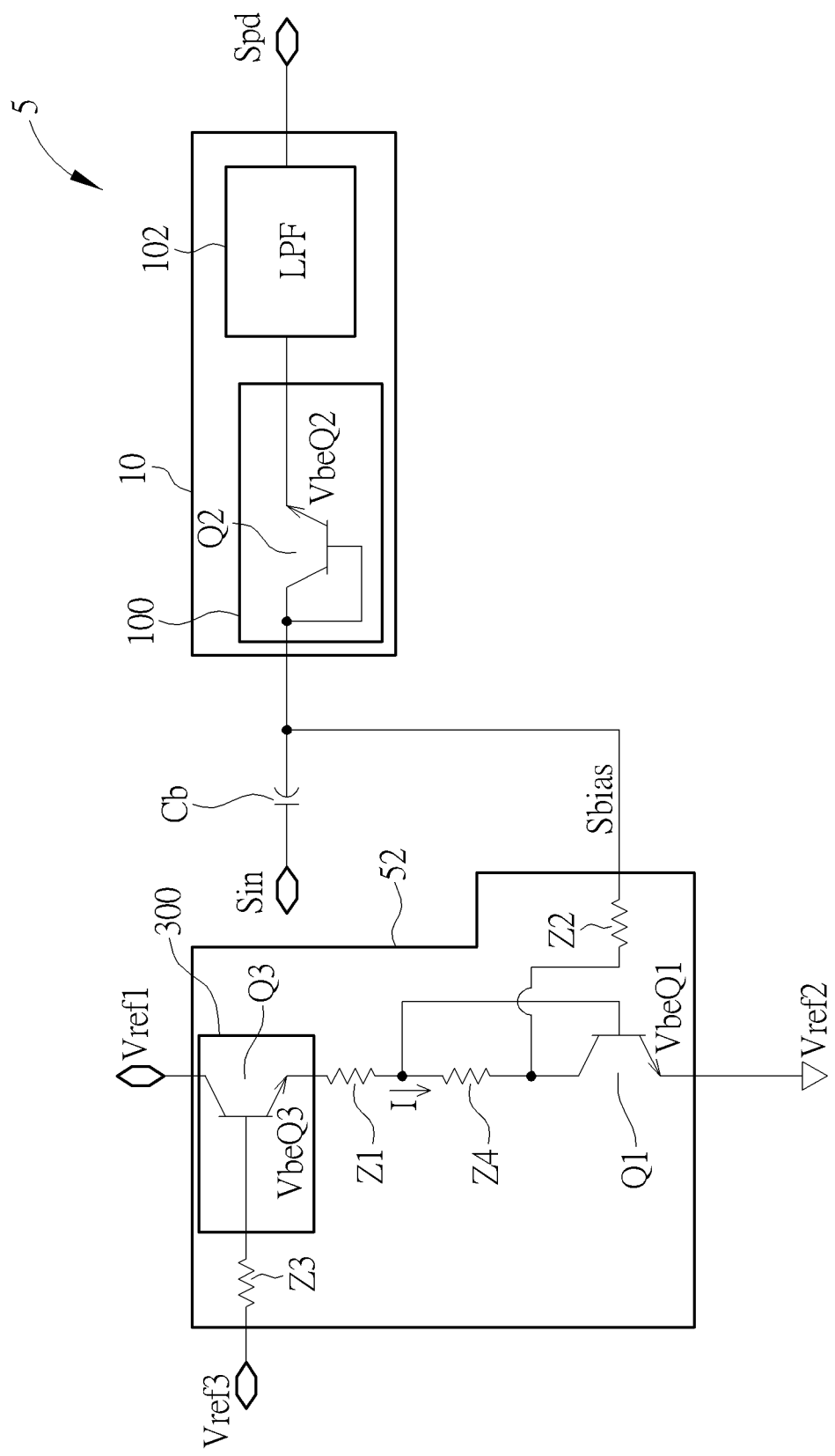
FIG. 5 is a circuit schematic of a power detector according to another embodiment of the invention.

FIG. 5 is a circuit schematic of a power detector 5 according to another embodiment of the invention. The configurations and connections of the power detector 5 are similar to the power detector 3, the difference lies in that the power detector 5 employs a bias circuit 52 in place of the bias circuit 32.

Compared to the bias circuit 32, the bias circuit 52 further includes an impedance unit Z4. The impedance unit Z4 will be explained as below. The impedance unit Z4 may include a first terminal and a second terminal. The first terminal of the impedance element Z4 may be coupled to the second terminal of the impedance unit Z1, and the second terminal of the impedance element Z4 may be coupled to the first terminal of the transistor Q1. Further, the first terminal of the transistor Q1 is coupled to the second terminal of the impedance unit Z1 via the impedance unit Z4. The impedance unit Z4 may be a resistor, a capacitor, an inductor, or a combination thereof. FIG. 4 shows an example of the impedance unit Z4 being a resistor. The impedance unit Z4 may be a current limiting resistor. The impedance units Z1 and Z4 may be used to adjust the current I flowing to the bias circuit 52, so as to keep the current I below 1 mA, for example, in a range of 300 μA to 500 μA. The impedance units Z1 and/or Z4 may also be used to adjust the slope of the bias signal Sbias to compensate for the change of the power indication signal Spd owing to the change of the forward voltage of the PN junction component 100, so that the power indication signal Spd is substantially invariant with temperature or varies slightly with temperature. In some embodiments, the impedance units Z1 and/or Z4 may be variable resistors. In some embodiments, the impedance of the impedance unit Z1 may be larger than the impedance of the impedance unit Z4, for example, the impedance unit Z1 may be 500Ω, and the impedance unit Z4 may be 200Ω. In other embodiments, the impedance of the impedance unit Z1 may be less than or equal to the impedance of the impedance unit Z4. In some embodiments, the impedance unit Z3 may be omitted. In other embodiments, the impedance unit Z3 and the switch unit 300 may be omitted.

Figure 6:
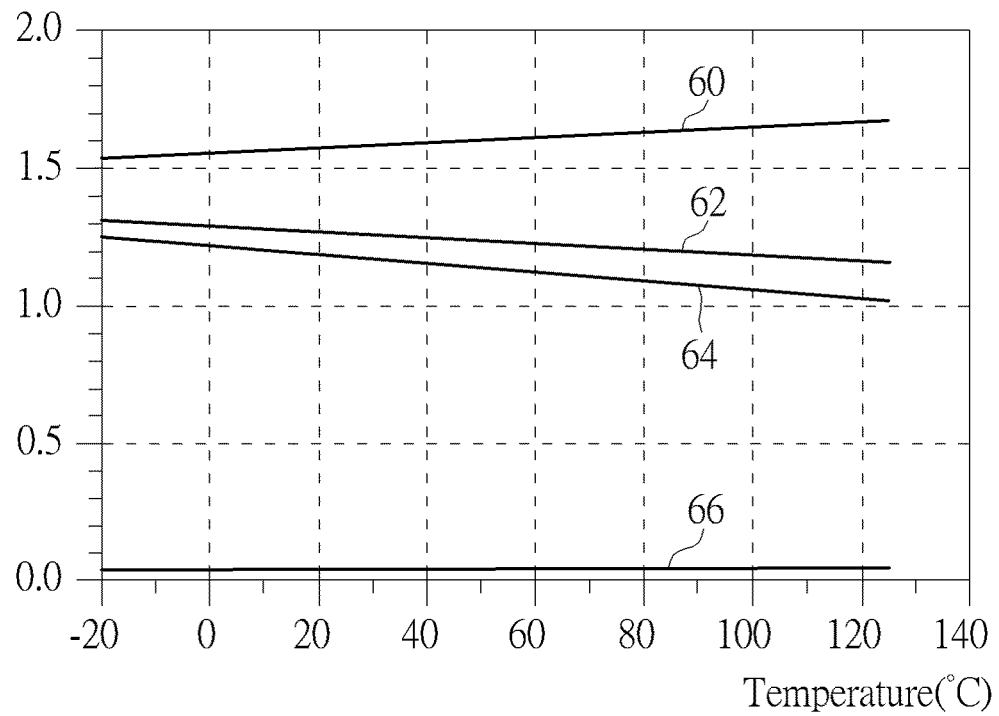
FIGS. 6 and 7 show temperature responses of selected signals of the bias circuit in FIG. 5.
Figure 7:
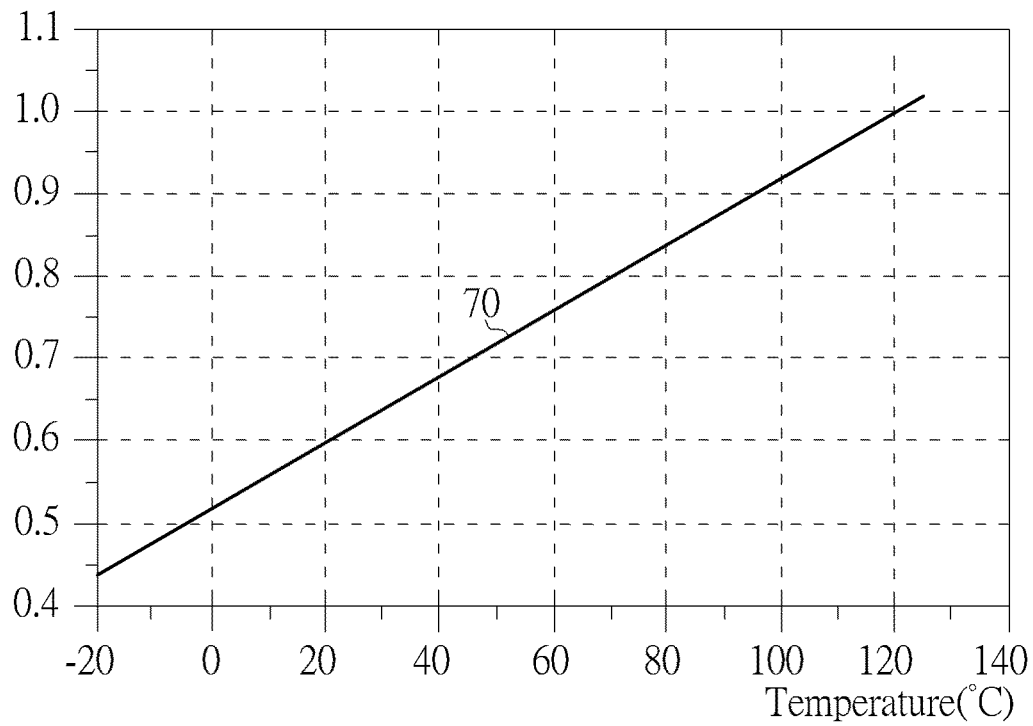

FIGS. 6 and 7 show temperature responses of selected signals of the bias circuit 52, thereby explaining the operation of the bias circuit 52. In FIG. 6, the horizontal axis represents temperature, and the vertical axis represents voltage, a curve 60 shows the voltage at the second terminal of the transistor Q3, a curve 62 shows the voltage at the control terminal of the transistor Q1, a curve 64 shows the voltage at the first terminal of the first transistor Q1, and a curve 66 shows the voltage of the power indication signal Spd. In FIG. 7, the horizontal axis represents temperature and the vertical axis represents current, and a curve 70 represents the current I flowing to the bias circuit 52. When the temperature rises, if the operating voltage Vref3 is a high voltage, the transistor Q3 may be turned on. Since the voltage VbeQ3 is negatively correlated to the temperature, the voltage VbeQ3 at the high temperature will be less than the voltage VbeQ3 at a low temperature, the voltage at the second terminal of the transistor Q3 may be approximately equal to the operating voltage Vref3 minus the voltage VbeQ3, and therefore, the curve 60 shows that the voltage at the second terminal of the transistor Q3 increases with rising temperature, and is thus positively correlated to the temperature. The voltage VbeQ1 is negative correlated to the temperature, the voltage VbeQ1 at the high temperature will be less than the voltageVbeQ1 at a low temperature, and therefore, the curve 62 shows that the voltage at the control terminal of the transistor Q1 decreases with rising temperature, and is thus negatively correlated to the temperature. The current I flowing into the bias circuit 52 may be approximately equal to the operating voltage Vref3 minus the voltage VbeQ3 and the voltage VbeQ1 and then divided by the impedance of the impedance unit Z1, the voltage at the first terminal of the impedance unit Z1 may correspond to the curve 60, the voltage at the second terminal of the impedance unit Z1 may correspond to the curve 62. Based on the curves 60 and 62, when the temperature difference increases, the voltage difference across the impedance unit Z1 will increase, and therefore, the curve 70 indicates that the current I flowing into the bias circuit 52 is positively correlated to the temperature. The voltage at the first terminal of the transistor Q1 may be approximately equal to the voltage at the second terminal of the impedance unit Z1 minus a product of the current I and the impedance of the impedance unit Z4. Since the voltage at the second terminal of the impedance unit Z1 is negatively correlated to the temperature, and the current I is positively correlated to the temperature, after the current I passes through the impedance unit Z4, the voltage at the first terminal of the transistor Q1 will drop significantly. FIG. 6 shows that the curve 64 has a steeper slope than the curve 62, and is negatively correlated to the temperature. The bias signal Sbias output from the bias circuit 32 may be regarded as corresponding to the curve 62, and the bias signal Sbias output from the bias circuit 52 may be regarded as corresponding to the curve 64. Compared to the bias circuit 32, the bias circuit 52 may provide a lower voltage of the bias signal Sbias. In this manner, the detection circuit 10 may receive the bias signal Sbias having the lower voltage, thereby outputting a power indication signal Spd having a relatively lower voltage. In other words, the bias signal Sbias output from the bias circuit 52 may be more beneficial for compensation of the increased power indication signal Spd owing to the change of the forward voltage of the PN junction component 100, e.g., the bias signal Vbias output from the bias circuit 52 may be used to further reduce the increased portion of the power indication signal Spd at the high temperature. Therefore, the curve 66 shows that the compensated power indication signal Spd is substantially invariant with temperature or varies slightly with temperature.

Figure 8:
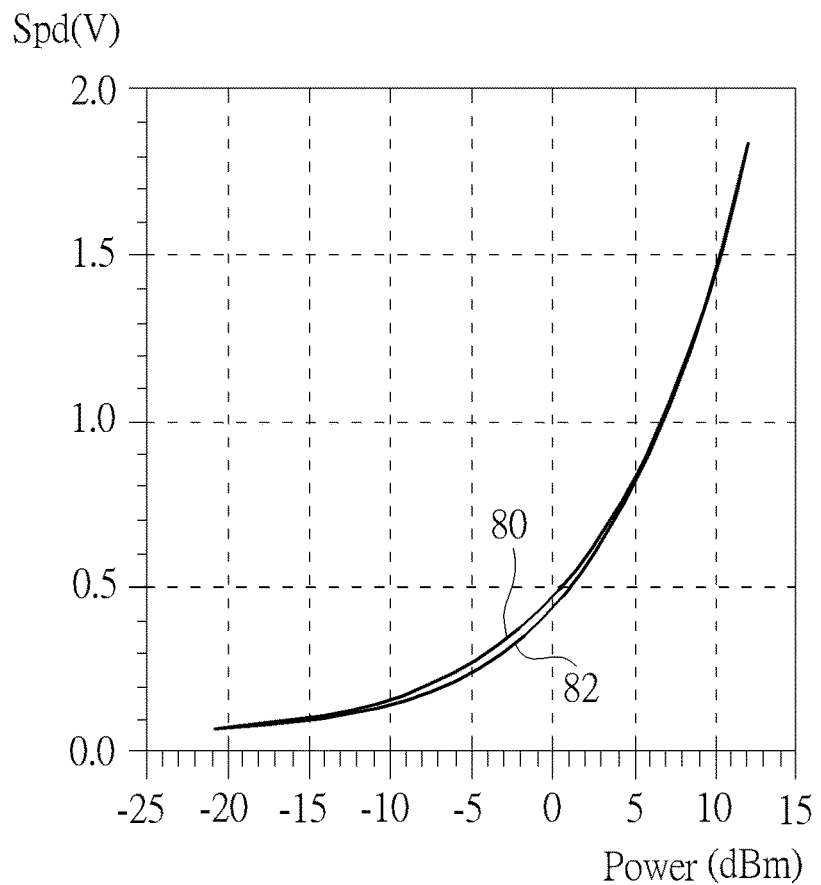
FIG. 8 shows the temperature response of the power indication signals of the power detector in FIG. 5 with respect to power.

FIG. 8 shows the temperature response of the power indication signals Spd of the power detector 5 in FIG. 5 with respect to power, wherein the horizontal axis represents the power, and the vertical axis represents the power indication signal Spd. FIG. 8 shows curves 80 and 82. When the power detector 5 receives identical input signals Sin at a low temperature (e.g. −20 degrees Celsius) and a high temperature (e.g. 120 degrees Celsius), the curve 80 represents the relationship between the power indication signal Spd of the power detector 5 and the corresponding powers at the high temperature, and the curve 82 represents the relationship between the power indication signal Spd of the power detector 5 and the corresponding powers at the low temperature. When the power indication signal Spd at a low temperature is employed as the output reference of the detection circuit 10, the curves 80 and 82 show a difference between the power indication signal Spd at the high temperature and the power indication signal Spd at the low temperature is substantially in the range of 22 mV, and the power indication signal Spd at the high temperature substantially approximates the power indication signal Spd at the low temperature. Compared to the related art and FIG. 4, the power detector 5 may significantly reduce the error between the power indication signal Spd at the high temperature and the power indication signal Spd at the low temperature, so that the change of the magnitude of the power indication signal Spd with the temperature is even less or is substantially closer to 0V. In some embodiments, the impedance of the impedance units Z1 and/or Z4 may be adjusted to change the slope of the curve 64 in FIG. 6, so as to change the difference between the curves 80 and 82 in FIG. 8, thereby adjusting the change of the magnitude of the power indication signal Spd with temperature.

Figure 9:
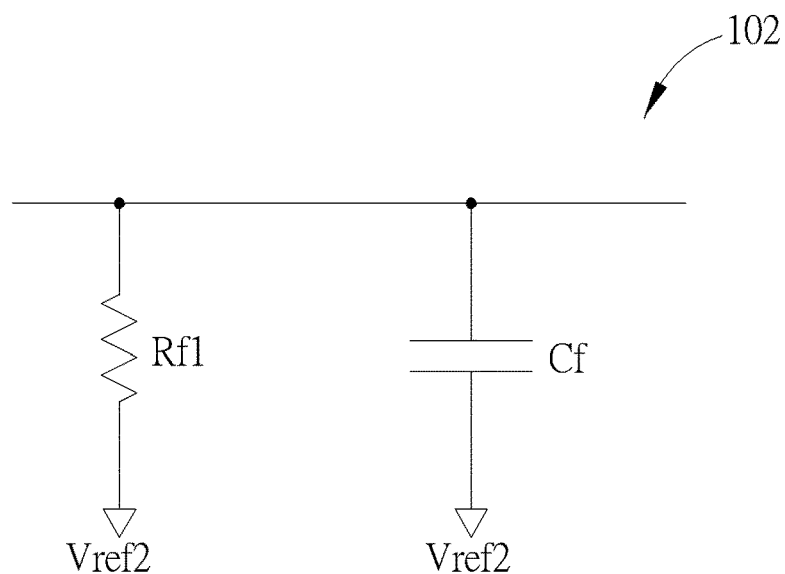
FIG. 9 is a circuit schematic of the low-pass filter in FIG. 1 to FIG. 3 and FIG. 5 according to an embodiment of the invention.

FIG. 9 is a circuit schematic of the low-pass filter 102 in FIG. 1 to FIG. 3 and FIG. 5 according to an embodiment of the invention. The low-pass filter 102 may include a resistor Rf1 and the capacitor Cf. The resistor Rf1 and the capacitor Cf may be coupled in parallel. The resistor Rf1 may include a first terminal and a second terminal. The first terminal of the resistor Rf1 may be coupled to the second terminal of the PN junction component 100, and the second terminal of the resistor Rf1 may receive the operating voltage Vref2. The capacitor Cf may include a first terminal and a second terminal. The first terminal of the capacitor Cf may be coupled to the first terminal of the resistor Rf1 and the output terminal of the detecting circuit 10, and the second terminal of the capacitor Cf may receive the operating voltage Vref2.

Figure 10:
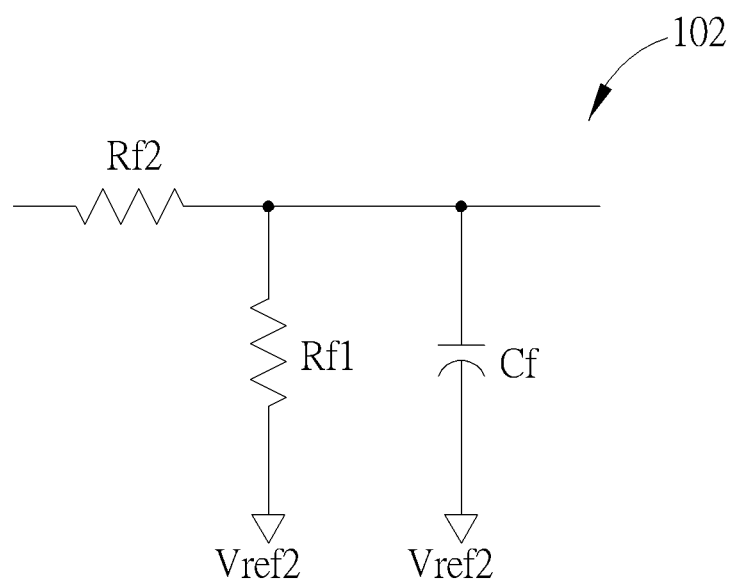
FIG. 10 is a circuit schematic of the low-pass filter in FIG. 1 to FIGS. 3 and 5 according to another embodiment of the invention.

FIG. 10 is a circuit schematic of the low-pass filter 102 in FIG. 1 to FIGS. 3 and 5 according to another embodiment of the invention. Compared to FIG. 9, FIG. 10 may further include a resistor Rf2 that may be coupled in series to the parallel-coupled resistor Rf1 and capacitor Cf. The resistor Rf2 may include a first terminal and a second terminal. The first terminal of the resistor Rf2 may be coupled to the second terminal of the PN junction component 100, and the second terminal of the resistor Rf2 may be coupled to the first terminal of the resistor Rf1. Further, the first terminal of the resistor Rf1 may be coupled to the second terminal of the PN junction component 100 via resistor Rf2. Compared to the low-pass filter 102 in FIG. 9, the low-pass filter 102 in FIG. 10 may further reduce ripples of the rectified input signal Sin, so as to generate the power indication signal Spd.

The power detectors in the various embodiments provide an adequate bias signal (e.g., a bias signal negatively correlated to the temperature) to the detection circuit by using the bias circuit, so as to compensate for the change in the power indication signal owing to the electrical characteristics of the detection circuit (e.g., the forward voltage of the PN junction component in the detection circuit being negatively correlated to the temperature), resulting in the power indication signal substantially invariant with temperature or varying slightly with temperature, and being favorable for determination of accurate power.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power detector comprising:
   a detection circuit comprising an input terminal configured to receive an input signal, and an output terminal configured to output a power indication signal; and
   a bias circuit comprising:
     a first terminal configured to receive a first operating voltage;
     a second terminal configured to receive a second operating voltage;
     an output terminal coupled to the input terminal of the detection circuit, and configured to output a bias signal;
     a first impedance unit comprising a first terminal coupled to the first terminal of the bias circuit, and a second terminal;
     a first transistor comprising a first terminal coupled to the second terminal of the first impedance unit, a second terminal coupled to the second terminal of the bias circuit, and a control terminal coupled to the second terminal of the first impedance unit;
     a second impedance unit comprising a first terminal and a second terminal; and
     a fourth impedance unit comprising a first terminal coupled to the second terminal of the first impedance unit and the control terminal of the first transistor, and a second terminal directly coupled to the first terminal of the first transistor and the first terminal of the second impedance unit;
     wherein the first terminal of the second impedance unit is coupled to the first terminal of the first transistor, and the second terminal of the second impedance unit is coupled to the output terminal of the bias circuit; or
     the first terminal of the second impedance unit is coupled to the second terminal of the first transistor, the second terminal of the second impedance unit is coupled to the second terminal of the bias circuit, and the first terminal of the first transistor is further coupled to the output terminal of the bias circuit.

2. The power detector of claim 1, wherein the bias signal is negatively correlated to a temperature.

3. The power detector of claim 1, wherein the detection circuit further comprises a PN junction component comprising a first terminal coupled to the input terminal of the detection circuit, and a second terminal coupled to the output terminal of the detection circuit.

4. The power detector of claim 3, wherein the PN junction component comprises:
   a diode comprising a first terminal coupled to the first terminal of the PN junction component, and a second terminal coupled to the second terminal of the PN junction component.

5. The power detector of claim 3, wherein the PN junction component comprises:
   a second transistor comprising a first terminal coupled to the first terminal of the PN junction component, a second terminal coupled to the second terminal of the PN junction component, and a control terminal coupled to the first terminal of the second transistor.

6. The power detector of claim 5, wherein the first transistor and the second transistor have temperature coefficients of a same sign.

7. The power detector of claim 6, wherein the temperature coefficients of the same sign are negative temperature coefficients.

8. The power detector of claim 5, wherein the first transistor and the second transistor are of a same transistor type.

9. The power detector of claim 8, wherein the first transistor and the second transistor are bipolar junction transistors, heterojunction junction bipolar transistors or field effect transistors.

10. The power detector of claim 5, wherein the bias circuit further comprises:
a switch unit comprising a first terminal coupled to the first terminal of the bias circuit, a second terminal coupled to the first terminal of the first impedance unit, and a control terminal configured to receive a third operating voltage.

11. The power detector of claim 10, wherein the bias circuit further comprises a third impedance unit comprising a first terminal configured to receive the third operating voltage, and a second terminal coupled to the control terminal of the switch unit.

12. The power detector of claim 10, wherein the switch unit comprises a third transistor comprising a first terminal coupled to the first terminal of the switch unit, a second terminal coupled to the second terminal of the switch unit, and a control terminal coupled to the control terminal of the switch unit.

13. The power detector of claim 12, wherein the first transistor, the second transistor and the third transistor have temperature coefficients of a same sign.

14. The power detector of claim 13, wherein the temperature coefficients of the same sign are negative temperature coefficients.

15. The power detector of claim 12, wherein the first transistor, the second transistor and the third transistor are of a same transistor type.

16. The power detector of claim 1, wherein an impedance of the first impedance unit is larger than an impedance of the fourth impedance unit.

17. The power detector of claim 1, wherein a current flowing into the bias circuit is positively correlated to a temperature.

18. The power detector of claim 3, wherein the detection circuit further comprises:
a low-pass filter coupled between the second terminal of the PN junction component and the output terminal of the detection circuit.

19. The power detector of claim 18, wherein the low-pass filter comprises a resistor and a capacitor.

\* \* \* \* \*